United States Patent
Sharon et al.

(10) Patent No.: US 10,626,503 B2
(45) Date of Patent: Apr. 21, 2020

(54) PARTICULATES AND METHODS OF MAKING PARTICULATES

(71) Applicant: Hamilton Sundstrand Corporation, Charlotte, NC (US)

(72) Inventors: John A. Sharon, West Hartford, CT (US); Ying She, East Hartford, CT (US); Paul Sheedy, Bolton, CT (US); James T. Beals, West Hartford, CT (US); Vijay Narayan Jagdale, South Windsor, CT (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 566 days.

(21) Appl. No.: 15/240,790

(22) Filed: Aug. 18, 2016

(65) Prior Publication Data
US 2018/0051376 A1 Feb. 22, 2018

(51) Int. Cl.
*C23C 18/16* (2006.01)
*C23C 14/22* (2006.01)
(Continued)

(52) U.S. Cl.
CPC ........ *C23C 18/1633* (2013.01); *B22F 1/0062* (2013.01); *B22F 3/1055* (2013.01); *B33Y 10/00* (2014.12); *B33Y 70/00* (2014.12); *C03B 19/01* (2013.01); *C04B 35/01* (2013.01); *C04B 35/56* (2013.01); *C04B 35/58* (2013.01); *C04B 35/62805* (2013.01); *C04B 35/62836* (2013.01); *C04B 35/62839* (2013.01); *C04B 35/62884* (2013.01); *C04B 35/62889* (2013.01);
(Continued)

(58) Field of Classification Search
CPC ..... C23C 14/22; C23C 18/1633; B33Y 10/00; B33Y 70/00; B22F 1/0062; B22F 3/1055; C04B 35/00; C04B 35/62085; C04B 35/62836; C04B 35/62839
USPC .......................................................... 428/403
See application file for complete search history.

(56) References Cited

U.S. PATENT DOCUMENTS 5,284,695 A * 2/1994 Barlow .................. B22F 3/004
156/272.8
5,749,041 A * 5/1998 Lakshminarayan .. B22F 3/1055
419/2
(Continued)

FOREIGN PATENT DOCUMENTS

GB   2545530   *   6/2017
GB   2545530 A     6/2017
(Continued)

OTHER PUBLICATIONS

Search Report received from the International Property Office (IPO) dated Jan. 25, 2018 for Application No. GB1713244.0.

*Primary Examiner* — Alexandre F Ferre
(74) *Attorney, Agent, or Firm* — Locke Lord LLP; Scott D. Wofsy; Georgi Korobanov

(57) ABSTRACT

A method of making an article using an additive manufacturing technique includes depositing a powder. The powder includes particles formed from an article material and having particle surfaces. A coating formed from a sacrificial coating is deposited over the particle surface. The sacrificial material has a composition that is different from the composition of the article material and is separated from the article material during fusing of the article material into a layer of an additively manufactured article.

15 Claims, 4 Drawing Sheets

(51) Int. Cl.
*B33Y 10/00* (2015.01)
*B22F 3/105* (2006.01)
*B33Y 70/00* (2020.01)
*B22F 1/00* (2006.01)
*C04B 35/628* (2006.01)
*C04B 35/01* (2006.01)
*C04B 35/653* (2006.01)
*C03B 19/01* (2006.01)
*C04B 35/56* (2006.01)
*C04B 35/58* (2006.01)

(52) U.S. Cl.
CPC ............ *C04B 35/653* (2013.01); *C23C 14/22* (2013.01); *C04B 2235/665* (2013.01); *Y02P 10/295* (2015.11)

(56) References Cited

U.S. PATENT DOCUMENTS

| | | | |
|---|---|---|---|
| 5,750,249 A * | 5/1998 | Walther | B05D 5/12 252/512 |
| 6,676,892 B2 * | 1/2004 | Das | B22F 3/1055 419/7 |
| 2002/0015654 A1 * | 2/2002 | Das | B22F 3/1055 419/8 |
| 2006/0167147 A1 * | 7/2006 | Asgari | A61K 9/0024 524/174 |
| 2007/0207266 A1 | 9/2007 | Lemke | |
| 2010/0045120 A1 * | 2/2010 | Kitano | B22F 1/0062 310/44 |
| 2010/0080921 A1 * | 4/2010 | Beardsley | C23C 4/06 427/456 |
| 2015/0125621 A1 * | 5/2015 | Chung | B22F 1/0062 427/536 |
| 2015/0321253 A1 | 11/2015 | Espinal et al. | |

FOREIGN PATENT DOCUMENTS

| | | | |
|---|---|---|---|
| WO | WO97/13601 | * | 4/1997 |
| WO | WO-9713601 A1 | | 4/1997 |
| WO | WO2015/106113 | * | 7/2015 |
| WO | WO2015106113 | * | 7/2015 |
| WO | WO-2015106113 A1 | | 7/2015 |
| WO | WO-2015112365 A1 | | 7/2015 |

* cited by examiner

PARTICULATES AND METHODS OF MAKING PARTICULATES

BACKGROUND OF THE INVENTION

1. Field of the Invention

The present disclosure relates additive manufacturing techniques, and more particularly to particulate feedstocks for additive manufacturing techniques.

2. Description of Related Art

Additive manufacturing (AM) is commonly employed to build structures by progressively adding layers to an underlying substrate. For example, in powder bed additive manufacturing processes, each layer is generally formed by adding powder to the substrate using a powder bed or feeder apparatus, melting or sintering the powder using an energy source, and allowing the melted or sintered powder to fuse to the underlying substrate. A succeeding layer is formed on the previous layer by adding additional powder and applying energy to the required locations.

The powders used in various AM processes can impose limitations on the efficacy of these techniques as well as the properties of the resulting structure. For example, some powders like titanium are flammable, and therefore require explosion or fire suppression precautions. Other powders, such as aluminum, have an affinity for oxygen, moisture, and/or other contaminants that may be present in the ambient environment, and therefore require specialized handling in order to prevent the powder from conveying contaminants present in the ambient environment into the structure formed from the powder through the AM technique. Some powders, such as oxygen-free high conductivity copper, may reflect significant amounts of energy applied to the powder during melting or sintering, reducing the throughput or requiring high output sources for the AM technique or even rendering the AM technique unsuitable.

In general, currently available AM techniques have been considered satisfactory for their intended purpose. However, there is still a need in the art for improved particulates, methods of making particulates, and methods of making articles using additive manufacturing techniques which will overcome some of the above limitations. The present disclosure provides a solution for this need.

SUMMARY OF THE INVENTION

A method of making an article using an additive manufacturing technique includes depositing a powder. The powder includes particles formed from an article material and having particle surfaces. A coating formed from a sacrificial coating is first deposited over the particle surface. The sacrificial material has a composition that is different from the composition of the powder and the article material, and is separated from the article material during fusing of the article material into a layer of an additively manufactured article.

In certain embodiments, fusing the article material can include heating the sacrificial material and conducting heat from the sacrificial material into the article material. Separating the sacrificial material from the article material can include floating the sacrificial material in the article material during melting of the powder and/or article material.

In accordance with certain embodiments, the method can include depositing additional powder over the separated sacrificial material. The sacrificial material from the additional powder can be separated from the article material. The sacrificial material from the additional material can be aggregated with the sacrificial material from the underlying fused article material.

It is also contemplated that, in accordance with certain embodiments, the article layer can be a first article layer and the method can include fusing additional article material to form a second article layer. Fusing the second article layer can require less incident energy than that required to fuse the first article layer per unit mass of article material.

A powder for use in an additive manufacturing technique includes a plurality of particles. The particles have particle surfaces and are formed from an article material. A particle coating is deposited over the particle surface and includes a sacrificial material. The sacrificial material has a composition that differs from a composition of the article material enabling the sacrificial material to be physically separated from the article material.

In certain embodiments the sacrificial material can be insoluble when present in liquid state article material. The sacrificial material can have lower density than the article material. The sacrificial material can have a reflectance that is lower than a reflectance of the article material. The sacrificial material can have an affinity for a contaminant, e.g., moisture or oxygen, moisture that is lower the affinity of the article material for the contaminant. The sacrificial material can be less flammable than the article material.

In accordance with certain embodiments, the sacrificial coating can be discontinuous. The sacrificial material can be deposited over only a portion of the particle surface. The sacrificial coating can be continuous. The sacrificial material can be deposited over the entire particle surface. The sacrificial material can include a carbonaceous material, an oxide, a nitride, and/or combinations thereof. The article material can include aluminum, titanium, copper, and alloys thereof. The article material can also include iron, cobalt, nickel-based super alloys, oxide, nitride, carbide ceramics, and glasses.

A method of making a powder for an additive manufacturing technique includes receiving particles formed from an article material and having particle surfaces. A sacrificial material is received and is deposited over at least a portion of the surface of the respective particles of the powder. In certain embodiment the coating is deposited over only a portion of the particle surface. In accordance with certain embodiments, the sacrificial coating is deposited over the entire surface of the particle. Deposition of the coating can include depositing the coating using a line of sight technique. Depositing the coating can include depositing the coating using a non-line of sight technique.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION OF THE PREFERRED EMBODIMENTS

Figure 1:
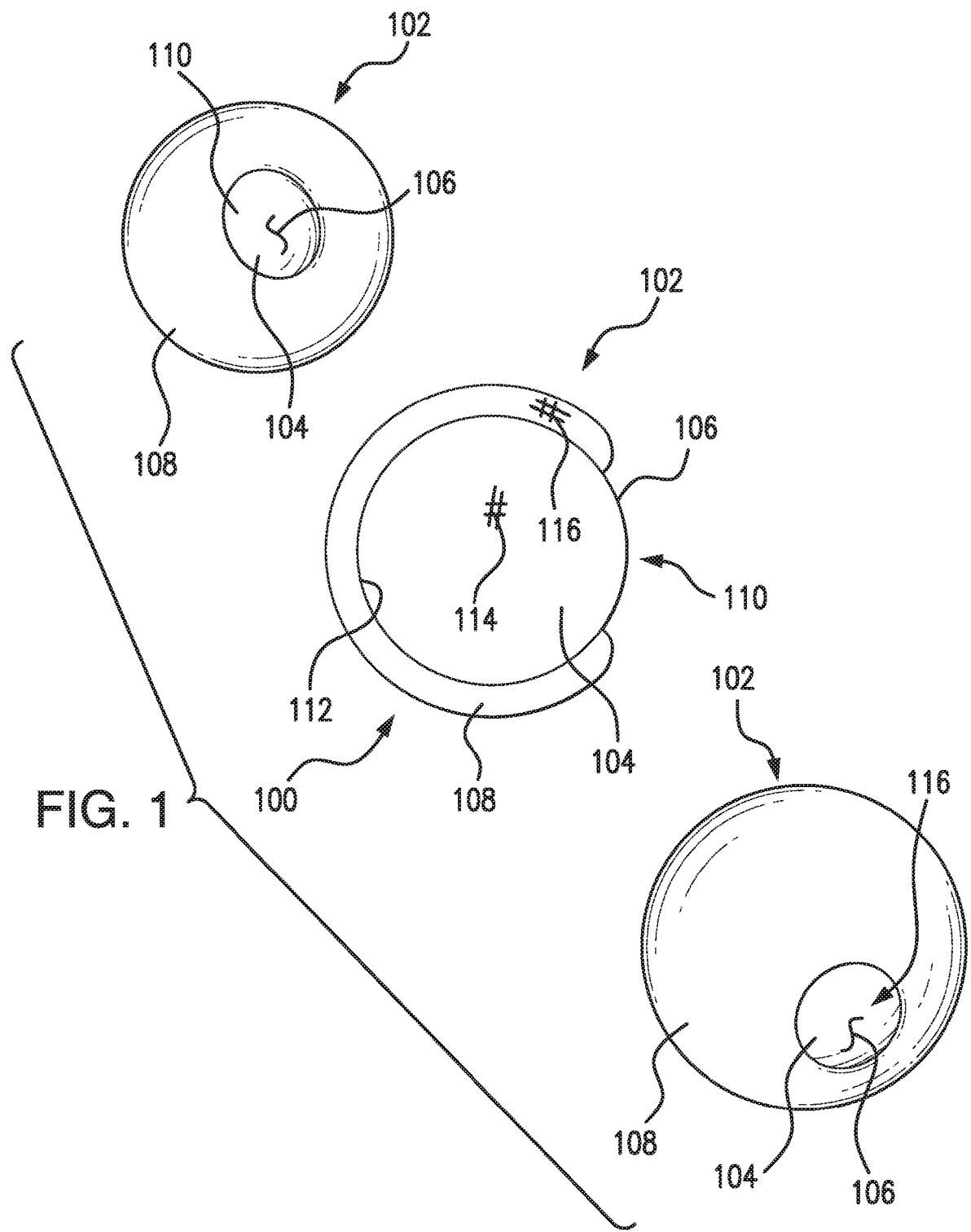
FIG. 1 is a schematic view of a powder according to exemplary embodiment constructed in accordance with the present disclosure, showing a powder comprised of particles formed from an article material and discontinuously covered by a sacrificial material.

Reference will now be made to the drawings wherein like reference numerals identify similar structural features or aspects of the subject disclosure. For purposes of explanation and illustration, and not limitation, a partial view of an exemplary embodiment of a powder for an additive manufacturing technique in accordance with the disclosure is shown in FIG. 1 and is designated generally by reference character 100. Other embodiments of powders, methods of making powders, and methods of making articles using such powders in accordance with the disclosure, or aspects thereof, are provided in FIGS. 2-4, as will be described. The systems and methods described herein can be used for making articles for aerospace applications with additive manufacturing techniques, though the present disclosure is not limited to aerospace applications or to additive manufacturing techniques in general.

Referring to FIG. 1, powder 100 is shown. Powder 100 includes a plurality of particles 102. Each of the plurality of particles 102 includes a particle body 104 with a surface 106 and a shell 108. Shell 108 is discontinuous, i.e. shell 108 is deposited over only a portion 112 of surface 106. A portion 110 of surface 106 is uncoated and is exposed to the ambient environment.

Particle body 104 includes an article material 114. Article material 114 includes a material suitable for interfusing with material from other particle bodies and/or an underlying substrate to form an article using an additive manufacturing technique. Article material 114 may be flammable, reactive to a contaminant (e.g., oxygen and/or moisture), and/or have a reflectivity that is relatively high to energy, e.g., directed energy, received in an additive manufacturing technique. In certain embodiments article material 114 is a metallic material and may include aluminum, titanium, copper, or an alloy thereof. It is also contemplated that article material 114 can include iron, a cobalt or nickel-based super alloy, an oxide, nitride, carbide-ceramic, and/or glass material. In embodiments particle body is entirely composed of a material suitable for forming an article using an additive manufacturing technique. Examples of additive manufacturing techniques include, without limitation, powder bed fusion, laser sintering, and plasma deposition.

Shell 108 includes a sacrificial material 116. Sacrificial material 116 is less reactive to contaminants present in the ambient environment than article material 114. Sacrificial material 116 being less reactive to contaminants than underlying particle body 104, shell 108 reduces the affinity that particle 102 otherwise has for such contaminants, preventing such contaminants from becoming incorporated in structures fabricated using powder 100. As will be appreciated by those of skill in the art in view of the present disclosure, preventing incorporation of contaminant into particle 102 reduces (or eliminates) the tendency of contaminates like moisture and oxygen to generate gas bubbles, blisters, and/or pores in additively manufactured articles which could otherwise develop as contaminants evolve compounds during fusing of article material 114.

In certain embodiments sacrificial material 116 is less flammable than article material 114. Sacrificial material 116 being less flammable than article material 114, shell 108 reduces the risk of particle body 104 igniting and combusting during storage and handling powder 100 than an uncoated powder formed from article material 114. This reduces or eliminates that need for specialized storage and handling systems, such as evacuated storage containers and inert gas handling systems. As will be appreciated by those of skill in the art in view of the present disclosure, reduced flammability can be advantageous in embodiments where particle body 104 is relatively small and formed from materials like aluminum.

It is contemplated that sacrificial material 116 not be incorporated in the article formed using the additive manufacturing technique. In this respect it is contemplated that sacrificial material 116 remain inert upon receipt of energy sufficient to fuse article material 114 into a layer of an additively manufactured article. For example, sacrificial material 116 may volatize and evaporate upon receipt of energy sufficient to melt or sinter article material 114. Sacrificial material 116 may remain in a solid-state upon receipt of energy sufficient to fuse article material 114 into a layer of an additively manufactured article. In certain embodiments, sacrificial material 116 may liquefy and resist incorporation into article material 114 upon receipt of energy sufficient to fuse article material 114 into a layer of an additively manufactured article. Sacrificial material 116 may include a carbonaceous material, an oxide, and/or a nitride by way of non-limiting example.

In certain embodiments sacrificial material 116 is insoluble in the presence of liquid state article material. Insolubility renders sacrificial material 116 severable from article material 114 upon receipt of energy sufficient to fuse article material 114 into an additively manufactured article, allowing sacrificial material 116 to facilitate the additive manufacturing process. In this respect sacrificial material 116 can be less dense than article material 114. This allows sacrificial material 116 to float to the top of article material 114 during fusing and form a slag that blankets that underlying layer or article material 114. The blanketing slag separates article material 114 from the ambient environment, preventing contaminants that may be present in the ambient environment and/or in the additive manufacturing apparatus build chamber environment from becoming incorporated into the additively manufactured article.

Sacrificial material 116 can have a reflectivity that is lower than that of article material 114. In shell form, the low reflectivity of sacrificial material 116 facilitates fusing article material 114 because of the intimate mechanical contact of sacrificial shell 108 with particle body 104. The intimate mechanical contact causes incident energy received by shell 108 to be conducted as heat into particle body 104, increasing the proportion of radiation absorbed by particle body 104 in relation to an uncoated state. This reduces the amount of energy necessary to fuse article material 114 into a layer of an additively manufactured article. As a blanketing slag subsequent to fusion, sacrificial material 116 forms an energy receiver that conducts heat from incident energy into subsequent deposited powder 100, further reducing the amount of energy necessary to fuse article material 114 into the additively manufactured article.

Figure 2:
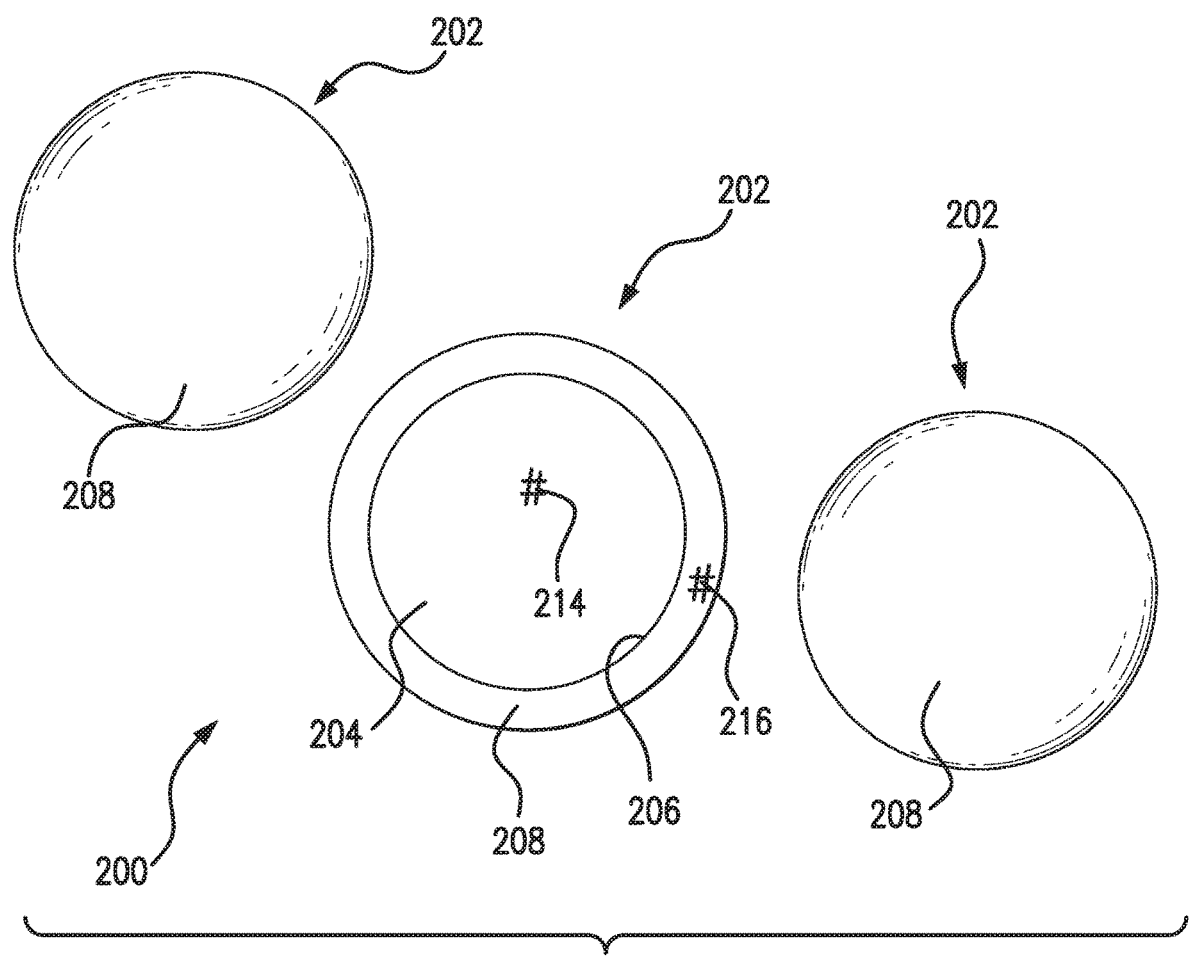
FIG. 2 is a schematic view of another embodiment of a powder, showing a powder comprised of particles formed from an article material and continuously covered by a sacrificial material.

With reference to FIG. 2, a powder 200 is shown. Powder 200 is similar to powder 100 (shown in FIG. 1) and additionally includes particles 202. Particles 202 have particle bodies 204 wholly encapsulated by a shell 208. Particle body 204 includes an article material 214 that is similar to article material 114 (shown in FIG. 1). Shell 208 is continuous, i.e. shell 208 is deposited over substantially the entirety of the surface 206 of particle body 204.

Shell 208 includes a sacrificial material 216. Sacrificial material 216 is similar to sacrificial material 116 (shown in FIG. 1) and separates the entirety of particle body 204 from the external environment. In this respect shell 208 (and sacrificial material 216) encapsulates particle body 204. Encapsulation of particle body 204 can substantially or fully seals article material 214 from the ambient environment, reducing or eliminating the likelihood of compounds from the ambient environment interacting with article material 214. In addition to the above described advantages of shell 108 (shown in FIG. 1), coating the entirety of surface 206 with sacrificial material 216 improves the durability of shell 208, e.g., shell 208 rendering sacrificial material 216 less likely to separate from particle body 204 during handling.

Figure 3:
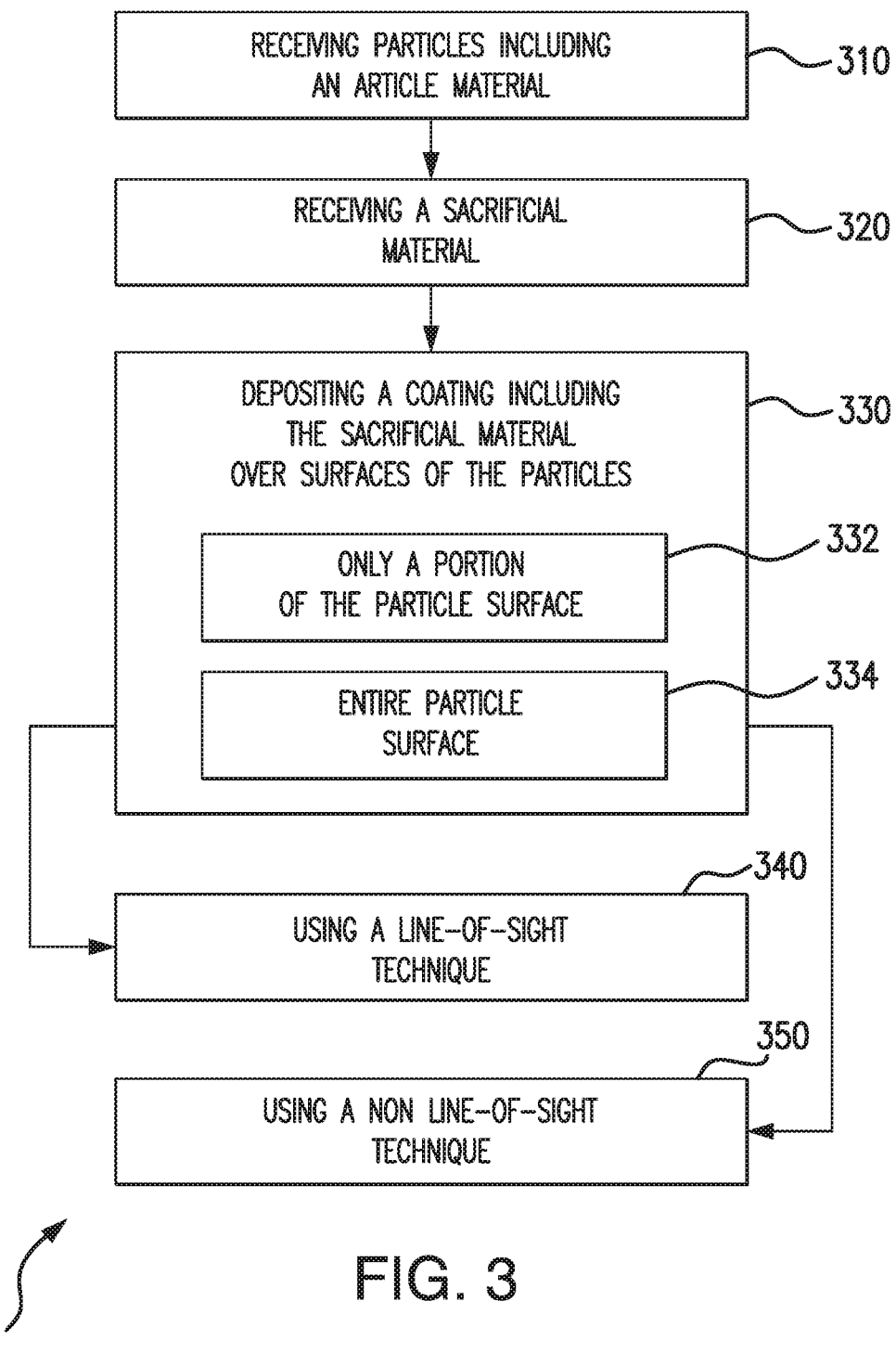
FIG. 3 is a schematic block diagram of a method of making a powder for use in an additive manufacturing technique, showing operations for coating particles with a sacrificial coating.

With reference to FIG. 3, a method 300 of making a powder for an additive manufacturing technique is shown. Method 300 includes receiving particles, e.g., particle body 104 (shown in FIG. 1), formed from an article material, e.g., article material 114 (shown in FIG. 1), as shown with box 310. The method also includes receiving a sacrificial material, e.g., sacrificial material 116 (shown in FIG. 1) as shown with box 320.

The sacrificial material is deposited over the surface, e.g., surface 106 (shown in FIG. 1), as show with box 330. The sacrificial material can be deposited over only a portion of the particle surface such at least a portion, e.g., surface portion 110 (shown in FIG. 1), remains uncoated and exposed to the external environment, as shown with box 332. Method 300 can also include coating an entirely of surface of the particle surface, e.g., surface 206 (shown in FIG. 2), as shown with box 334.

Coating the particle surface with the sacrificial material can include using a non-line of sight technique, as shown with box 340. Line of sight techniques allow for coverage of only a portion of the particle surface. Such discontinuous surfaces can be advantageous when particles are relatively small, and have correspondingly large surface areas relative to particle mass. Examples of suitable line of sight techniques include, without limitation, fixed bed coating reactors, physical vapor deposition techniques (e.g., evaporation, sputtering, pulsed laser deposition), chemical vapor deposition techniques, electro-less plating techniques, and solid-liquid mixing with pyrolysis techniques.

Coating the particle surface with the sacrificial material can include using a non-line of sight technique, as shown with box 350. Non-line of sight techniques enable coverage of the entire particle surface. Developing such continuous coatings can be advantageous when particles are relatively large and have correspondingly small surface areas in relation to the particle mass. Examples of suitable non-line of sight techniques include, without limitation, use of fluidized bed reactors, atomic layer deposition techniques, chemical vapor deposition techniques, pyrolysis after solid-liquid mixing, and electro-less plating techniques. It is contemplated that a fixed bed reactor with a vibration module and/or a tumbling/rotation module for agitating the particulate during coating can also be used to apply a continuous sacrificial material coating.

Figure 4:
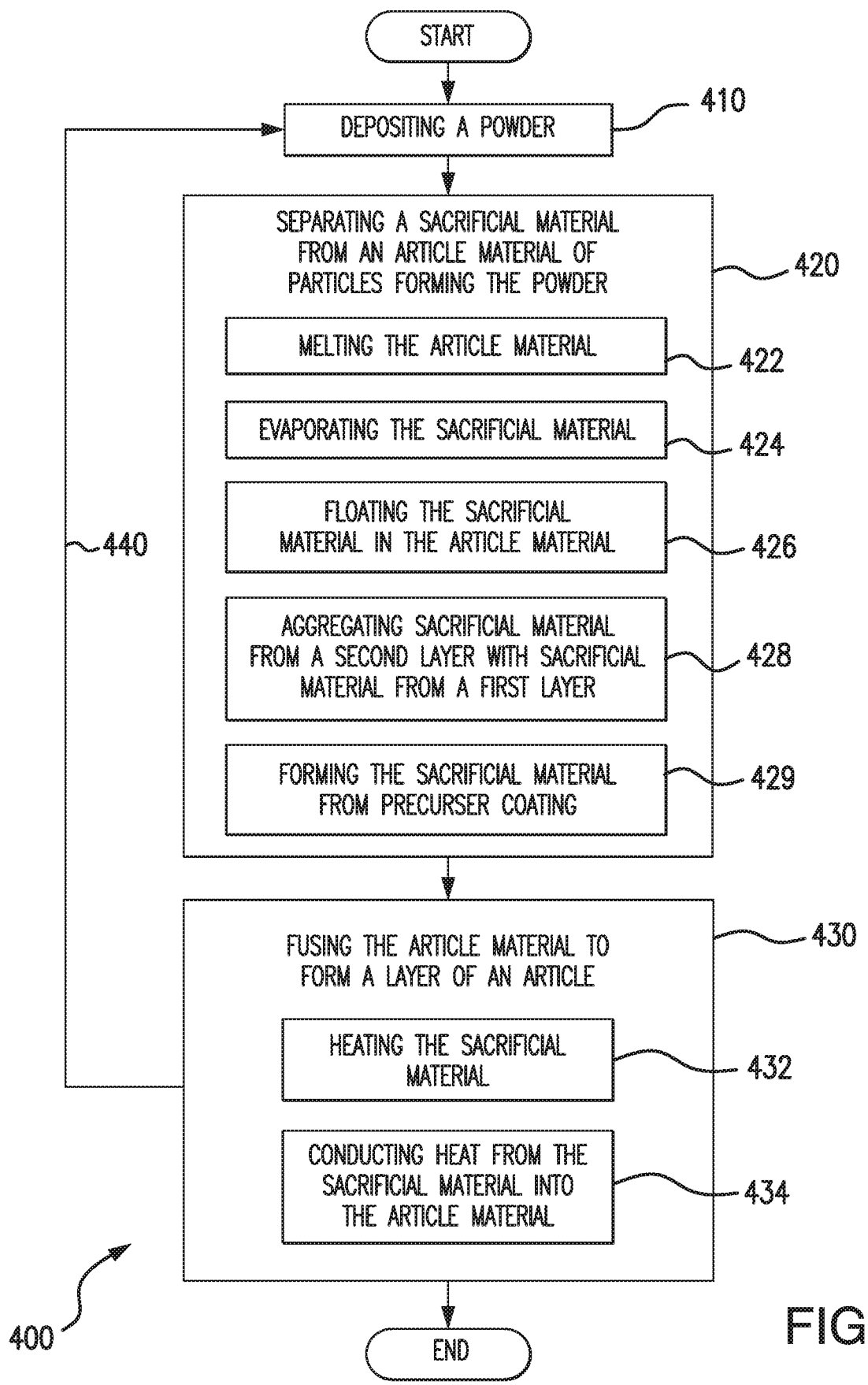
FIG. 4 is a schematic block diagram of a method of making an article using an additive manufacturing technique, showing operations for separating the sacrificial material from the article material and fusing the article material to form the article.

With reference to FIG. 4, a method 400 of making an article using an additive manufacturing technique is shown. Method 400 includes depositing a powder, e.g., powder 100 (shown in FIG. 1), as shown with box 410. Particles, e.g., particles 102 (shown in FIG. 1), of the powder are fused with one another to form a layer of an additively manufactured article, as shown with box 420.

A sacrificial material, e.g., sacrificial material 116 (shown in FIG. 1) is separated from an article material forming the particle, e.g., article material 114 (shown in FIG. 1) during the fusing operation, as shown with box 430. Separation can be accomplished by melting the article material, as shown with box 422. The sacrificial material can be evaporated, as shown with box 424, such by application of directed energy. The sacrificial material can be floated in the molten article material, as shown with box 426, and thereafter aggregated with sacrificial material from a previously fused layer of the article, as shown with box 428.

Fusing the article material to form the layer of the additively manufactured article can include heating the sacrificial material, as shown with box 432. Heating can be done using an energy source, such as a laser or electron beam, directed at the sacrificial material coating and forming the shell of the particle. The heat generated within the sacrificial coating is then conducted into the article material forming the underlying particle body, e.g., particle body 104 (shown in FIG. 1).

The sacrificial material can separate from the molten article material according to density and solubility, the less dense and insoluble sacrificial material floating to a surface of the molten material. It is also contemplated that the at least a portion (and in embodiments substantially all) of the sacrificial material remain in a solid state subsequent to receiving the energy. Once separated, the sacrificial material can remain in proximity to the article material. For example, the sacrificial material can remain within the build chamber of an additive manufacturing apparatus subsequent to separation. In certain embodiments, substantially all the sacrificial material remains in intimate mechanical contact with the fused article material subsequent to separation.

In contemplated embodiments, the sacrificial material can be formed from a precursor coating applied to particles of the powder, as shown with 429. In this respect the energy applied to the article material for purposes of fusing the article material can cause the precursor coating to form the sacrificial material. Once formed the sacrificial material thereafter assists in the fusing of the article material by conducting heat from the incident energy into the article material. As will be appreciated by those of skill in the, this reduces the amount of incident energy necessary to fuse the article material. It can also change the reflectivity during the fusing process, particles coated with a more highly reflective precursor material darkening upon application of the directed energy, thereafter being less reflective, and therefore more readily adsorbing incident energy. As will appreciated by those of skill in the art in view of the present disclosure, aggregating the sacrificial material from the new powder with that separated from the previously separated sacrificial powder incrementally increases the amount of sacrificial material present to receive energy, reducing the amount of energy necessary to fuse successive layers as the additively manufactured article is constructed. This can be particularly advantageous in certain embodiments where the sacrificial material has a reflectivity that is lower than the reflectivity of the article material.

In certain embodiments, the particles can have a coating deposited over the particle surface formed from a polymer or polymeric material. Subsequent to deposition into the build chamber of an additive manufacturing apparatus, the polymer can be volatized to form a carbonaceous coating over surfaces of the powder. The underlying particle can then be melted, and the carbonaceous material separated from the article material. The coating can itself be a precursor material that forms in situ the sacrificial coating, the sacrificial coating thereafter affording the above-described advantages. Alternatively, a sacrificial oxide or nitride coating could result from decomposition of a nitrate, carbonate, or other precursor coating deposited on the powder.

As indicated by arrow 440, the melted particle article material can solidify as a layer of an additively manufactured article, new powder deposited, and the article material and sacrificial material of the powder fused and separated, respectively.

The methods and systems of the present disclosure, as described above and shown in the drawings, provide powders for additive manufacturing techniques, methods of making powders for additive manufacturing techniques, and methods of making articles for additive manufacturing techniques including relatively low reflectivity, reduced flammability, and/or resistance to environmental contamination. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A method of making an article, comprising:
depositing a powder, the powder comprising:
particles comprising an article material and having particle surfaces; and
particle coatings comprising a sacrificial material deposited over the particle surfaces, wherein the sacrificial material has a composition different from a composition of the article material, wherein depositing the coating includes (a) depositing a polymer over at least a portion of the particles surfaces, (b) disposing the coating particles in a build chamber, (c) converting the deposited precursor to form a carbonaceous, oxide, or nitride coating, and (d) separating the coating from the particulate in the build chamber;
separating the sacrificial material from the article material; and
fusing the article material to form a layer of an article.

2. The method as recited in claim 1, wherein separating the sacrificial material comprises:
melting the article material; and
floating the sacrificial material in the molten article material or vaporizing the sacrificial material.

3. The method as recited in claim 1, wherein fusing the article material comprises heating the sacrificial material and conducting heat from the sacrificial material into the article material.

4. The method as recited in claim 1, further comprising:
depositing additional powder over the separated sacrificial material;
separating sacrificial material from the additional powder; and
aggregating the sacrificial material underlying the additional powder with the sacrificial material separated from the additional powder.

5. The method as recited in claim 4, wherein the article layer is a first article layer, and further comprising fusing the additional article material to form a second article layer, wherein fusing the second article layer requires less incident energy than fusing the first article layer per unit mass of article material.

6. A powder for use in an additive manufacturing technique, comprising:
a plurality of particles comprising an article material and having particle surfaces; and
particle coatings comprising a sacrificial material deposited over the particle surfaces, wherein the sacrificial material has a composition different from a composition of the article material, wherein depositing the coating includes (a) depositing a polymer over at least a portion of the particles surfaces, (b) disposing the coating particles in a build chamber, (c) converting the deposited precursor to form a carbonaceous, oxide, or nitride coating, and (d) separating the coating from the particulate in the build chamber.

7. The powder as recited in claim 6, wherein the sacrificial material is insoluble in the article material.

8. The powder as recited in claim 6, wherein the sacrificial material is less dense than the article material.

9. The powder as recited in claim 6, wherein the sacrificial material has a reflectance that is less than a reflectance of the article material.

10. The powder as recited in claim 6, wherein the sacrificial material has affinity for a contaminant that is lower than affinity for the contaminant of the article material.

11. The powder as recited in claim 6, wherein the sacrificial material is less flammable than the article material.

12. The powder as recited in claim 6, wherein the sacrificial material comprises one or more of a carbonaceous material, an oxide, and a nitride.

13. The powder as recited in claim 6, wherein the article material comprises one or more of an oxide, a nitride, a carbide ceramic, glass, aluminum, titanium, copper, iron, nickel, cobalt, titanium, and alloys thereof.

14. A method of making a powder for an additive manufacturing technique, comprising:
receiving particles comprising an article material and having particle surfaces;
receiving a sacrificial material; and
depositing a coating comprising the sacrificial material over at least a portion of the particle surfaces, wherein depositing the coating includes (a) depositing a polymer over at least a portion of the particles surfaces, (b) disposing the coating particles in a build chamber, (c) converting the deposited precursor to form a carbonaceous, oxide, or nitride coating, and (d) separating the coating from the particulate in the build chamber.

15. The method of making a powder as recited in claim 14, wherein depositing the coating comprises depositing the coating using a line of sight coating technique.

* * * * *